(12) United States Patent
Lee

(10) Patent No.: US 6,271,092 B1
(45) Date of Patent: Aug. 7, 2001

(54) METHOD FOR FABRICATING A SEMICONDUCTOR DEVICE

(75) Inventor: Sang-Gi Lee, Choongcheongbuk-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/770,305

(22) Filed: Jan. 29, 2001

(30) Foreign Application Priority Data

Aug. 16, 2000 (KR) .............................................. 2000-47188

(51) Int. Cl.$^7$ .................................................. H01L 21/336
(52) U.S. Cl. .......................... 438/279; 438/286; 438/299; 438/423; 438/520; 438/981
(58) Field of Search ..................................... 438/279, 286, 438/296, 275, 299, 300, 305, 306, 407, 423, 440, 520, 528, 588, 594, 981

(56) References Cited

U.S. PATENT DOCUMENTS

| | | | |
|---|---|---|---|
| 5,480,828 | * | 1/1996 | Hsu et al. .............................. 438/275 |
| 5,920,779 | * | 7/1999 | Sun et al. .............................. 438/275 |
| 6,117,711 | * | 9/2000 | Wu ........................................ 438/154 |
| 6,165,849 | * | 12/2000 | An et al. ............................... 438/275 |

\* cited by examiner

Primary Examiner—Charles Bowers
Assistant Examiner—Jack Chen
(74) Attorney, Agent, or Firm—Morgan, Lewis & Bockius LLP

(57) ABSTRACT

A method for fabricating a semiconductor device of the present invention comprises steps of forming a first oxide layer on a semiconductor substrate comprising a memory cell unit and an input/output circuit unit, removing selectively the first oxide layer on the memory cell unit, forming a photoresist layer on the first oxide layer on the input/output circuit unit and the semiconductor substrate of the memory cell unit, forming openings on regions where gate electrodes will be formed by patterning the photoresist layer, forming oxygen containing layers by implanting the oxygen ion in the semiconductor substrate on the memory cell unit and the first oxide layer of the input/out circuit unit through the openings, removing the photoresist layer, forming a trench inside of the semiconductor substrate on the memory cell unit by removing the oxygen containing layer formed in the semiconductor substrate, etching the first oxide layer as a certain thickness, forming the gate electrodes on the upper surface of the first oxide layer on the input/output circuit unit and the trench on the memory cell unit, forming impurity regions by implanting the impurity ions into the semiconductor substrate at the both sides of the gate electrode, forming sidewall spacers on the both sides of the gate electrodes, and forming the source/drain region by implanting the impurity ions into the semiconductor substrate by using the sidewall spacers as a mask.

5 Claims, 5 Drawing Sheets

METHOD FOR FABRICATING A SEMICONDUCTOR DEVICE

This application claims the benefit of Korean Application No. 47188/2000, filed in the Republic of Korea on Aug. 16, 2000, which is hereby incorporated by reference.

BACKGROUND OF THE INVENTION

1. Field of the Invention

The present invention relates to a method for fabricating a semiconductor device, in particular to a method for fabricating the semiconductor device which comprises transistors with an elevated source/drain structure and transistors with a normal source/drain structure.

2. Description of the Background Art

Many semiconductor manufacturers have made great efforts to improve a density of semiconductor devices. In recent years, in a field of the semiconductor devices, particularly to memory devices, transistors of a memory cell unit are designed to operate at about 1.8V of low voltage and transistors of an input/output circuit unit are designed to operate at 3.3V or 5V higher than a operating voltage of memory cell unit. Thus, a thickness of a gate insulation layer of transistors in a memory cell unit is different from a thickness of a gate insulation layer of transistors in an input/output circuit unit.

A method for fabricating devices having different thickness of gate insulation layers in one semiconductor substrate will now be described.

As shown in FIG. 1A, a thick oxide layer 101 is formed on the upper surface of a substrate 100.

Then a photoresist layer 102 is formed on all upper surface of the thick oxide layer 101 and patterned by photo lithography process, thereby remaining photoresist layer 102 only on the thick oxide layer 101 of an input/output circuit unit "A" as shown in FIG. 1B. Then, thick oxide layer 101 of a memory cell unit "B" is etched away using the photoresist layer 102 as a mask.

As shown in FIG. 1C, after removing the photoresist layer 102, a thin oxide layer 103 is formed on the upper surface of the semiconductor substrate 100 of the memory cell unit "B".

As shown in FIG. 1D, gate electrodes 104 are formed on the each upper surface of the thick oxide layer 101 and thin oxide layer 103. Then lightly doped impurity regions 105 are formed in the semiconductor substrate 100 by implanting impurity ions at both sides of each gate electrode 104.

As shown in FIG. 1E, sidewall spacers 106 are formed on both sides of each gate electrode 104. Source/drain regions 107 are formed by implanting the impurity ions into the semiconductor substrate 100 at the both sides of the sidewall spacers 106. After that, a silicide layer 108 is formed on the upper surface of the source/drain regions 107.

However, the above-described conventional method for fabricating the semiconductor device has the below problems. In the transistors of the memory cell unit, many problems such as a short channel effect may occur because a length of the channel is very short, particularly a punch-through phenomenon, is serious. In addition, an increase of junction leakage current is a problem when the silicide layer is formed on the upper surface of the source/drain because a depth of the source/drain junction is decreased.

SUMMARY OF THE INVENTION

The present invention provides a method for fabricating a semiconductor device having transistors with an elevated source/drain structure for a memory cell unit and transistors with a normal source/drain structure for an input/output circuit, which is capable of improving density of the semiconductor device without deteriorating characteristics of the semiconductor device by differing thickness of a gate insulation layer of the input/output circuit unit and memory cell unit, restraining the short channel effect by forming the elevated source/drain structure on the memory cell unit, and decreasing a junction leakage current.

A method for fabricating a semiconductor device of the present invention comprises steps of forming a first oxide layer on an upper surface of the semiconductor substrate comprising the memory cell unit and input/output circuit unit, removing selectively the first oxide layer on the memory cell unit, forming a photoresist layer on an upper surface of the semiconductor substrate of the memory cell unit and an upper surface of the first oxide layer formed on the semiconductor substrate of the input/output circuit unit, forming openings on the region where gate electrodes will be formed by patterning the photoresist layer, forming oxygen containing layers by implanting the oxygen ions into the semiconductor substrate of the memory cell unit and in the first oxide layer through the openings, removing the photoresist layer, forming a trench in the semiconductor substrate of the memory cell unit by removing the oxygen containing layer, etching the first oxide layer as a certain thickness, forming gate electrodes on the upper surface of the first oxide layer of the input/output circuit unit and the trench on the memory cell unit, forming impurity regions by implanting the impurity ions into the semiconductor substrate at both sides of the gate electrodes, forming the sidewall spacers on the both sides of the gate electrode, and forming the source/drain regions by implanting the impurity ions into the semiconductor substrate by using the sidewall spacers as a mask.

The present invention further comprises forming a silicide layer on an upper surface of the source/drain regions.

The step of removing the oxygen containing layer of the present invention is performed by a wet etching process using a BOE (Buffered Oxide Etchant).

In the step of etching the first oxide layer to a certain thickness, the certain thickness is about ½ of the initial thickness of the first oxide layer.

The etching of the first oxide layer is performed by using a HF solution.

DETAILED DESCRIPTION OF THE PREFERRED EMBODIMENT

Figure 1A:
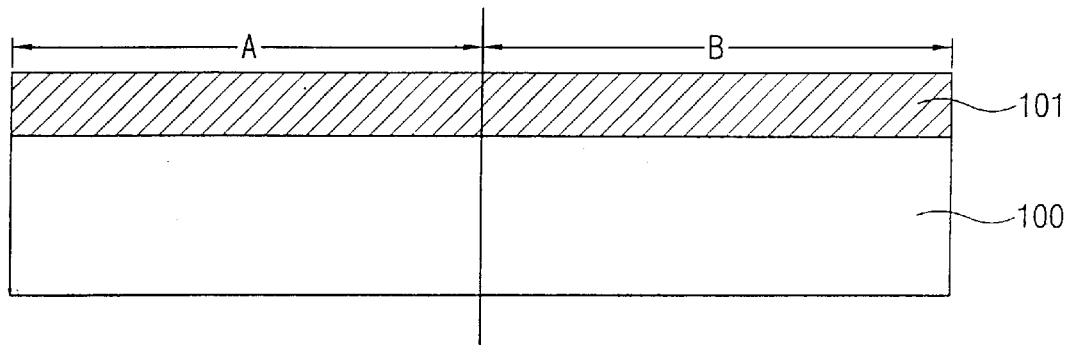
FIGS. 1A–1E are cross sectional views illustrating a method for fabricating a semiconductor device in accordance with the conventional method.
Figure 1B:
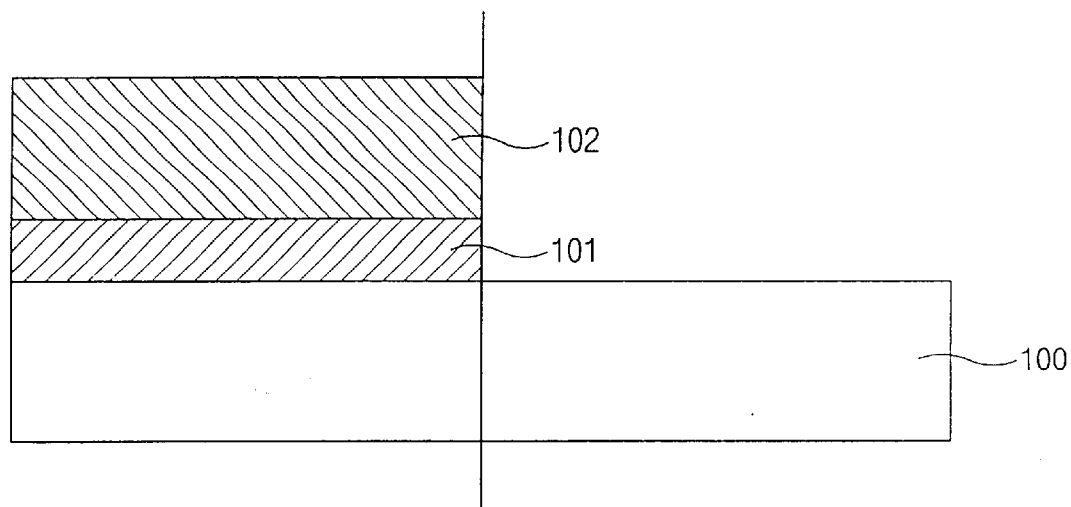
Figure 1C:
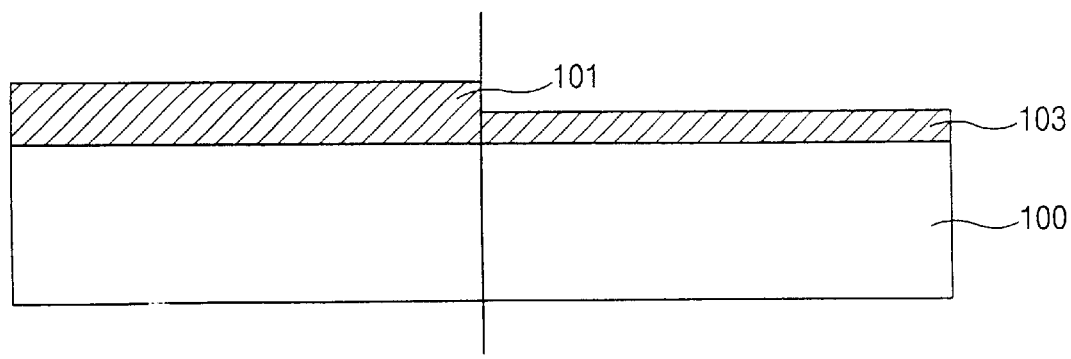
Figure 1D:
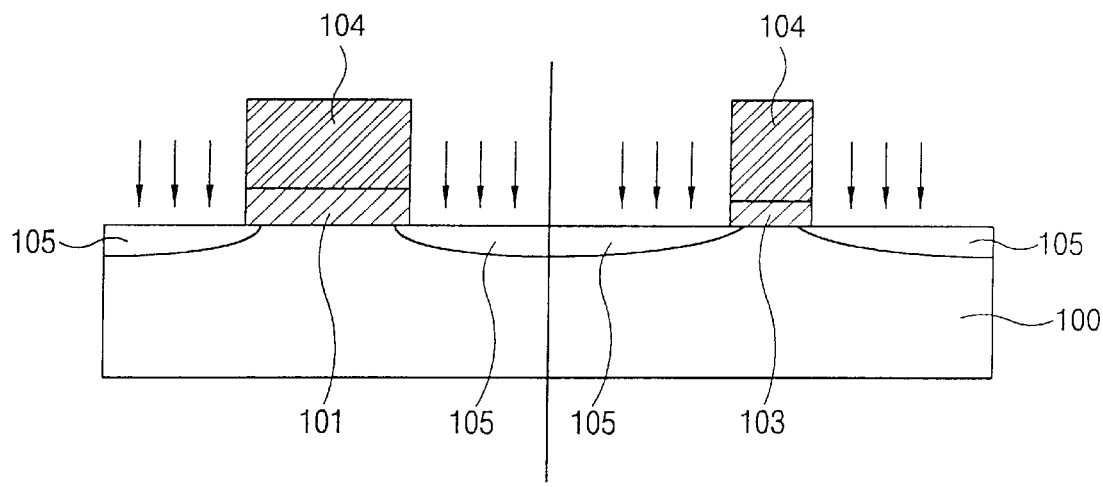
Figure 1E:
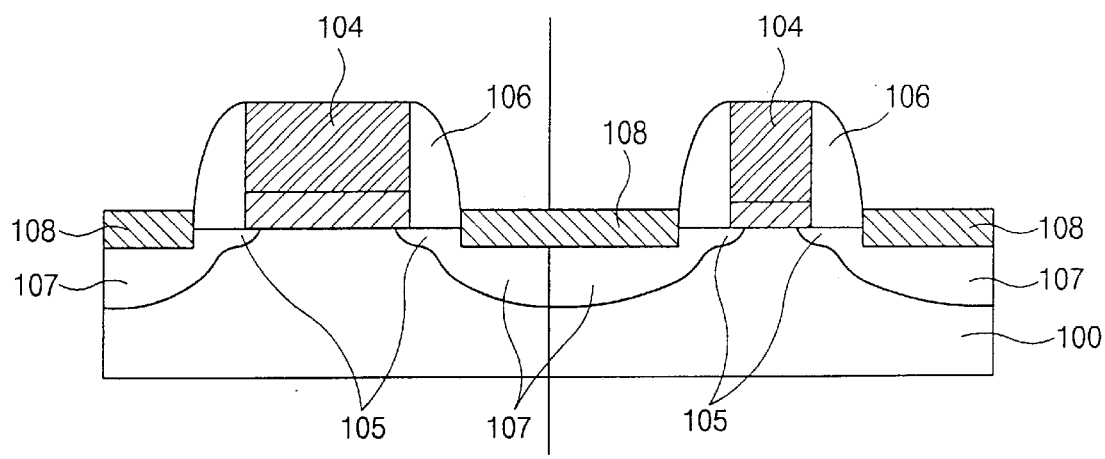
Figure 2A:
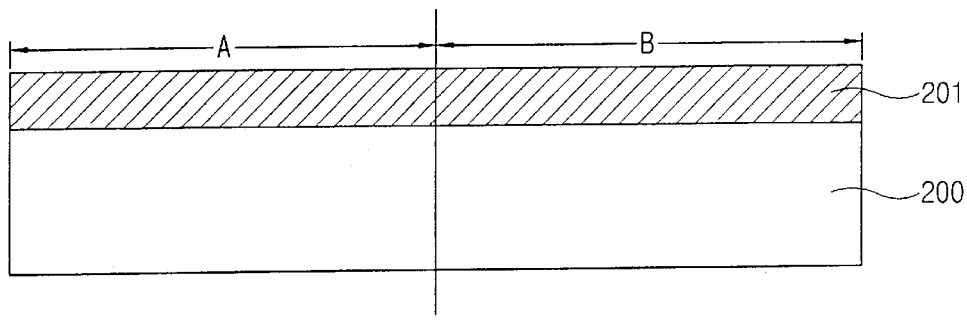
FIGS. 2A–2H are cross sectional views illustrating a method for fabricating a semiconductor device in accordance with the present invention.

A method for fabricating a semiconductor device of the present invention will now be described with reference to FIGS. 2A–2H As shown in FIG. 2A, a first oxide layer 201 is formed on the upper surface of a semiconductor substrate 200.

Figure 2B:
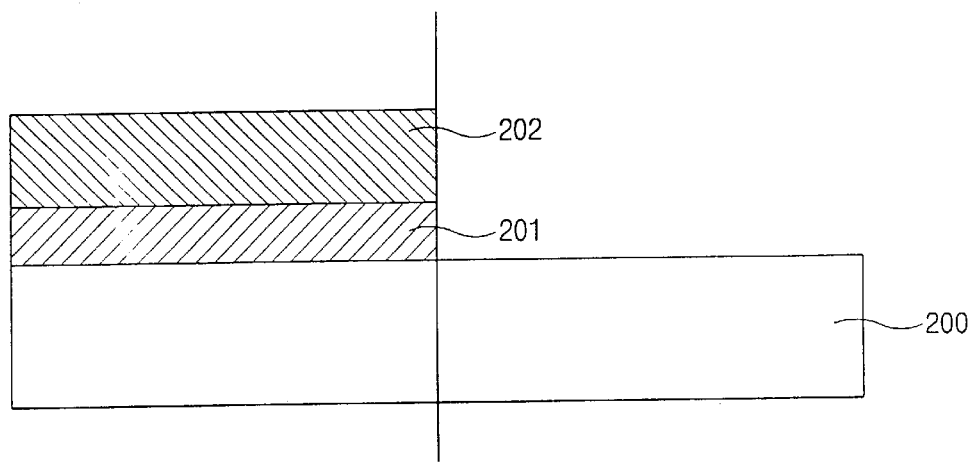

As shown in FIG. 2B, a first photoresist layer is formed on the upper surface of the first oxide layer 201, and the first photoresist layer 202 is saved only on the upper surface of the first oxide layer 201 of an input/output circuit unit "A"

by patterning the first photoresist layer. After that, the upper surface of the semiconductor substrate 200 of a memory cell unit "B" is exposed by etching the first oxide layer 201 of a memory cell unit "B" by using the first photoresist layer 202 as a mask. Then, the first photoresist layer 202 is removed.

Figure 2C:
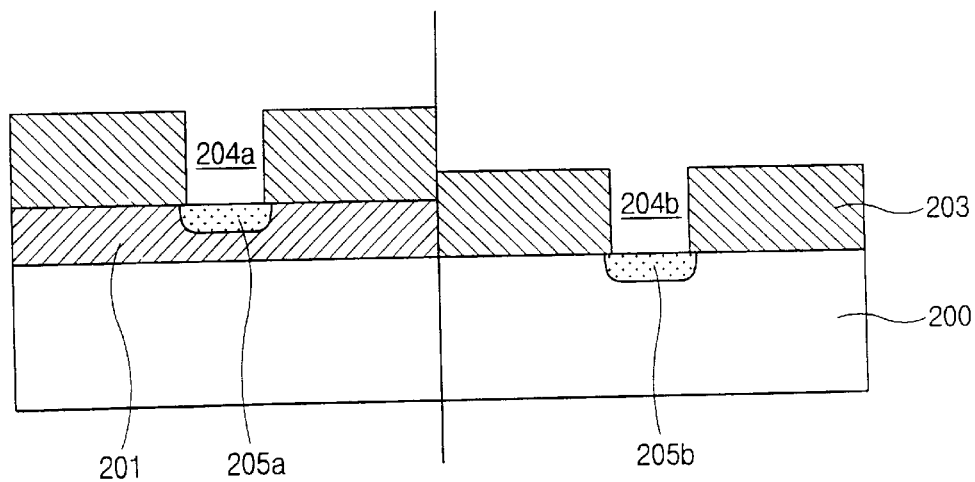

As shown in FIG. 2C, a second photoresist layer 203 is formed on the upper surface of the first oxide layer 201 of the input/output circuit unit "A" and the upper surface of the semiconductor substrate 200 of the memory cell unit "B". After that, patterning of the second photoresist layer 203 is performed by using a gate electrode mask of the input/output circuit unit "A" and memory cell unit "B". Openings 204a, 204b corresponding to the size of a gate electrode are formed on the second photoresist layer 203. Oxygen containing layers 205a, 205b are separately formed by implanting oxygen inside of the semiconductor substrate 200 of the memory cell unit and the first oxide layer 201 of the input/output circuit unit "A" through the openings 204a, 204b. Then, the second photoresist layer pattern 203 is removed.

Figure 2D:
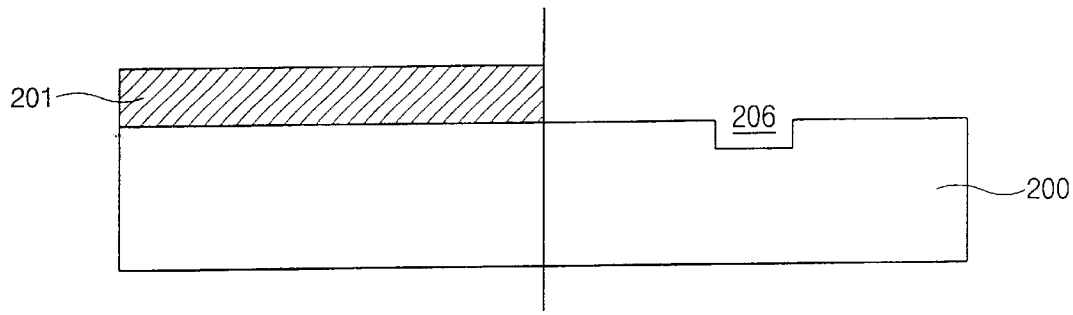

As shown in FIG. 2D, a trench 206 is formed inside of the semiconductor substrate 200 on the memory cell unit "B" by removing the oxygen containing layer 205b of the semiconductor substrate 200 by using the BOE (Buffered Oxide Etchant—a mixed solvent of HF and $NH_4F$ having volumetric ratio of 6:1). In other words, the semiconductor substrate 200 made of silicon is hardly by the BOE, but the oxygen containing layer 205b easily etched by the BOE. Herein, the upper surfaces of the first oxide layer 201 and oxygen containing layer 205a of the input/output circuit unit "A" are generally etched. The first oxide layer 201 and oxygen containing layer 205a formed inside of the first oxide layer 201 are same oxide material. Accordingly, the trench 206 is formed only inside of the semiconductor substrate 200 of the memory cell unit "B".

Figure 2E:
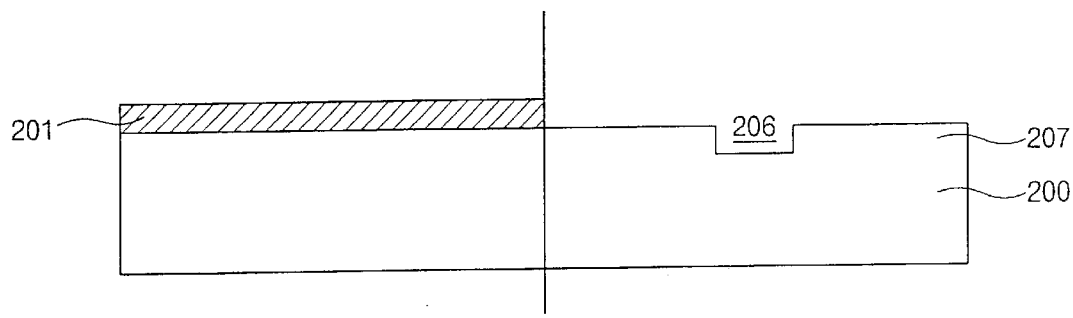

As shown in FIG. 2E, the first oxide film 201 of the input/output circuit unit "A" is etched as a certain thickness by cleaning the upper surface of the semiconductor substrate having the structure of FIG. 2D with the HF solvent. Thickness of the first oxide layer 201 is decreased as about ½ of the initially formed thickness. The first oxide layer 201 of the input/out circuit unit "A" is etched while it is cleaned with the HF solvent, but the upper surface of the semiconductor substrate 200 of the memory cell unit "B" is not etched because it is silicon.

Figure 2F:
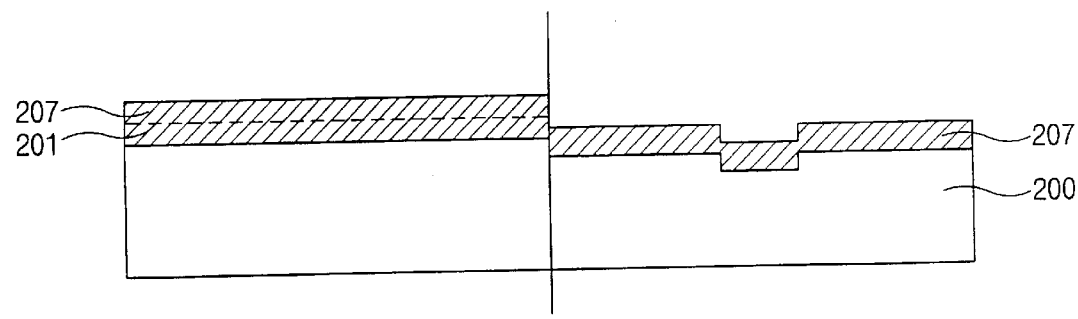

After that, as shown in FIG. 2F, the second oxide layer 207 is formed on the upper surface of the first oxide layer 201 formed at the input/output circuit unit "A" and the overall upper surface of the semiconductor substrate 200 of the memory cell unit "B" by a thermal oxidation method. Accordingly, relatively thick oxide layer is formed at the input/output circuit unit "A" and relatively thin oxide layer is formed at the memory cell unit "B".

Figure 2G:
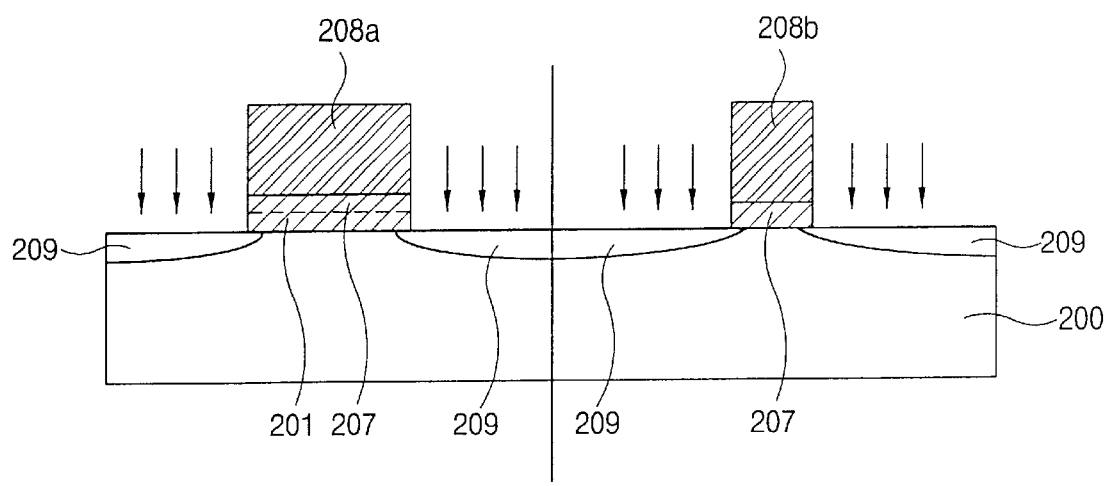

As shown in FIG. 2G, the gate electrodes 208a, 208b are formed at the input/output circuit unit "A" and memory cell unit "B", respectively, by forming a polysilicon layer on the upper surface of the second oxide layer 207 and patterning it. After that, lightly doped impurity regions 209 are formed by implanting impurity ions inside of the both semiconductor substrate 200 of the gate electrode.

Figure 2H:
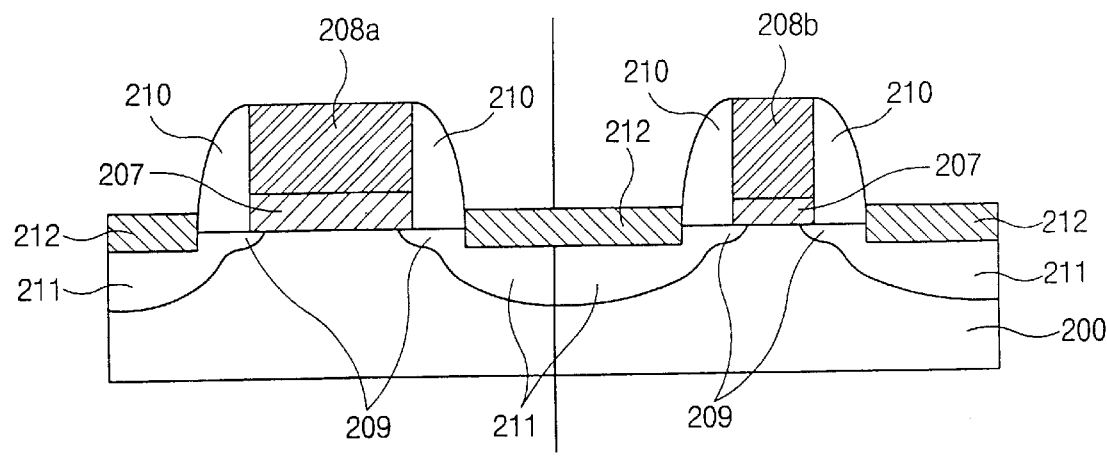

As shown in FIG. 2H, an insulation layer is formed on the overall upper surface of the semiconductor substrate 200, sidewall spacers 210 are formed on the sidewall of the gate electrodes 208a, 208b by performing an anisotropic etching process to the insulation layer without a mask. A highly doped impurity regions 211, namely, source/drain regions 211 are formed by implanting impurity ions inside of the semiconductor substrate 200 at the outer side of the sidewall spacers 210.

After that, a silicide layer 212 is formed on the upper surface of the source/drain regions 211 by well known methods.

The present invention is capable of improving density of the semiconductor device without deteriorating characteristics of the semiconductor device by differing thickness of the gate oxide layer of the input/output circuit unit and memory cell unit, restraining the short channel effect by adopting the elevated source/drain structure at the memory cell unit of the semiconductor device, and improving operation speed of the semiconductor device by forming a silicide layer on the source/drain regions decreasing a junction leakage current.

What is claimed is:

1. A method for fabricating a semiconductor device, comprising:

forming a first oxide layer on a semiconductor substrate comprising a memory cell unit and an input/output circuit unit;

removing selectively the first oxide layer on the memory cell unit;

forming a photoresist layer on the first oxide layer of the input/output circuit unit and on the semiconductor substrate of the memory cell unit;

forming openings on regions where gate eletrodes will be formed by patterning the photoresist layer;

forming an oxygen containing layer by implanting oxygen ions into the semiconductor substrate at the memory cell unit through the openings;

removing the photoresist layer;

forming a trench inside of the semiconductor substrate of the memory cell unit by removing the oxygen containing layer;

etching the first oxide layer on the input/output circuit unit to a certain thickness;

forming gate electrodes on the first oxide layer on the input/output circuit unit and the trench at the memory cell unit, respectively;

forming impurity regions by implanting ions into the semiconductor substrate at both sides of the gate electrodes;

forming sidewall spaces on the both sides of the gate electrodes; and forming source/drain regions by implanting impurity ions into the semiconductor substrate by using the sidewall spacers as a mask.

2. The method according to claim 1, wherein the method further comprises a step of forming silicide layers on the source/drain regions.

3. The method according to claim 1, wherein the step of forming the trench by removing the oxygen containing layer is performed by a wet etching process using a BOE (Buffered Oxide Etchant).

4. The method according to claim 1, wherein the step of etching the first oxide layer to a certain thickness includes etching the first oxide to be ½ thickness of an initial thickness.

5. The method according to claim 4, wherein the step of etching the first oxide layer is performed by wet etching using a HF solution.

* * * * *